United States Patent
Den Harder et al.

(10) Patent No.: US 9,488,709 B2
(45) Date of Patent: Nov. 8, 2016

(54) RESTRICTION OF THE IMAGING REGION FOR MRI IN AN INHOMOGENEOUS MAGNETIC FIELD

(75) Inventors: Johan Michiel Den Harder, Eindhoven (NL); Clemens Bos, Eindhoven (NL); Ulrike Andrea Blume, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 565 days.

(21) Appl. No.: 14/004,823

(22) PCT Filed: Feb. 14, 2012

(86) PCT No.: PCT/IB2012/050661
§ 371 (c)(1),
(2), (4) Date: Sep. 12, 2013

(87) PCT Pub. No.: WO2012/123830
PCT Pub. Date: Sep. 20, 2012

(65) Prior Publication Data
US 2014/0002080 A1  Jan. 2, 2014

(30) Foreign Application Priority Data
Mar. 17, 2011 (EP) ..................................... 11158694

(51) Int. Cl.
*G01R 33/54* (2006.01)
*G01R 33/44* (2006.01)
*G01R 33/565* (2006.01)

(52) U.S. Cl.
CPC ........... *G01R 33/543* (2013.01); *G01R 33/445* (2013.01); *G01R 33/56536* (2013.01); *G01R 33/56563* (2013.01)

(58) Field of Classification Search
CPC .............. G01R 33/543; G01R 33/445; G01R 33/56536; G01R 33/56563
See application file for complete search history.

(56) References Cited

U.S. PATENT DOCUMENTS

| 5,757,188 | A  | 5/1998  | Miyazaki |
| 6,424,152 | B1 | 7/2002  | Prins    |
| 6,806,707 | B2 | 10/2004 | Schreck  |
| 7,535,227 | B1 | 5/2009  | Koch     |

(Continued)

OTHER PUBLICATIONS

Den Harder, C.J. et al "MR Imaging near Orthopedic Implants using Slice-Encoding for Metal Artifact Correction and Off-Resonance Suppression", Proc. Intl. Soc. Mag. Reson. Med. vol. 19, 2011, p. 3170.

(Continued)

*Primary Examiner* — Rodney Bonnette (57) ABSTRACT

When magnetic resonance imaging in the vicinity of a metallic object (like, for instance, a metal implant), severe spatial perturbations of the static magnetic field occur. In order to suppress the back-folding of distant off-resonant signals into the region of interest, the imaging volume is spatially restricted by selection gradients applied concurrently with the excitation and the refocusing RF pulses in a spin echo sequence. The selection gradient applied during the excitation pulse has an amplitude and/or a polarity different from that of the selection gradient applied during the refocusing pulse so that the respectively selected slices in an off-resonance frequency versus spatial coordinate diagram become tilted with respect to one another. The applied imaging technique may of the SEMAC or MAVRIC type and may incorporate compressed sensing, parallel imaging, fat suppression and/or SVD-based noise reduction.

18 Claims, 10 Drawing Sheets

(56) References Cited

U.S. PATENT DOCUMENTS

| | | |
|---|---|---|
| 2001/0025141 A1 | 9/2001 | Butts |
| 2001/0045830 A1 | 11/2001 | Maier |
| 2002/0101237 A1 | 8/2002 | Miyosi |
| 2005/0017719 A1 | 1/2005 | Heubes |
| 2010/0308828 A1 | 12/2010 | Koch |

OTHER PUBLICATIONS

Koch, K.M. et al."Imaging Near Metal with a MAVRIC-SEMAC Hybrid", Magnetic Resonance in Medicine, vol. 65, 2011, pp. 71-82.

Rangwala, Novena et al "Reduction of Fast Spin Echo Cusp Artifact Using a Slice-Tilting Gradient", Magnetic Resonance in Medicine, vol. 64, 2010, pp. 220-228.

Bos, C. et al "MR Imaging Near Orthopedic Implants with Artifact Reduction using View-Angle Tilting and Off-Resonance Suppression", ISMRM, 2010.

Hargreaves, B.A. et al Fat Suppressed and Distortion-Corrected MRI near Metallic Implants, Proc. Intl. Cos. Mag.Reson.Med, 2010.

Lu, W et al "Compressive Slice Encoding for Metal Artifact Correction", Proc. Intl. Soc. Mag.Reson.Med, 2009.

Hargreaves, B.A. et al "Adaptive Slice Encoding for Metal Artifact Correction", Proc. Intl. Soc. Mag. Reson.Med, 2010.

Lu, W. et al "Noise Reduction in Slice Encoding for Metal Artifact Correction using Singular Value Decomposition", Proc. Intl. Soc. Mag.Reson.Med, 2010.

Chen, W. et al "Parallel MRI near Metallic Implants", Proc. Intl. Soc. Mag.Reson.Med, vol. 17, 2009.

Zho, S.Y. et al "Stent Imaging Using Metal Artifact Reduction Sequence", Proc. Intl. Soc. Mag.Reson.Med, 2010.

Koch, Kevin M. et al "A Multispectral Three Dimensional Acquisition Technique for Imaging Near Metal Implants", Magnetic Resonance in Medicine, vol. 61, 2009, pp. 381-390.

Lu, W. et al "Towards Artifact-Free MRI Near Metallic Implants", Proc. Intl. Soc. Mag.Reson.Med, vol. 16, 2008 p. 838.

Koch, K.M. et al. Z-Selective Multi-Spectral 3D Imaging: A MAVRIC-SEMAC Hybrid, Magnetic Resonance in Medicine, 2010.

Koch, K.M. et al "MAVRIC Imaging Near Metal Implants with Improved Spatial Resoluation and Reduced Acquisition Time", ISMRM, 2010.

RESTRICTION OF THE IMAGING REGION FOR MRI IN AN INHOMOGENEOUS MAGNETIC FIELD

CROSS-REFERENCE TO PRIOR APPLICATIONS

This application is the U.S. National Phase application under 35 U.S.C. §371 of International Application No. PCT/IB2012/050661, filed on Feb. 14, 2012, which claims the benefit of European Patent Application No. 11158694.7, filed on Mar. 17, 2011. These applications are hereby incorporated by reference herein.

TECHNICAL FIELD

The invention relates to magnetic resonance imaging, in particular to imaging techniques for selectively encoding spins from a restricted imaging region.

BACKGROUND OF THE INVENTION

Multi-spectral imaging techniques MAVRIC and SEMAC image acquisition techniques are currently being investigated for reduction of susceptibility artefacts due to the presence of metal.

The MAVRIC acquisition is not volume selective and MAVRIC will therefore suffer from back-folded signal if the encoded volume is too small. The slice selection used in SEMAC is a single frequency band selection in combination with a single selection gradient strength for both refocusing and excitation, which may cause distant off-resonance signals to be selected, resulting in back-folded signal.

In Koch et. al., "Multiple Resonant Frequency Offset Acquisitions for Imaging of Metallic Implants," Magnetic Resonance in Medicine, volume 61, 2009, pp. 381-390, the MAVRIC imaging technique is explained.

In Lu et. al., "SEMAC: Slice Encoding for Metal Artifact Correction in MRI," Magnetic Resonance in Medicine, volume 62, 2009, pp. 66-76, the SEMAC image acquisition technique is explained.

In C. Bos et al., 'MR imaging near orthopedic implanted with artefact reduction using view-angle tilting and off-resonance suppression', ISMRM 2010 abstract 1128, view angel tilting is explained.

SUMMARY OF THE INVENTION

The invention provides for a medical apparatus, a computer program product, and a method in the independent claims. Embodiments are given in the dependent claims.

There is therefore the need for better acquisition techniques for performing magnetic resonance imaging in the vicinity of metal objects.

In some embodiments the above mentioned problem and others may be solved by adapting the acquisition scheme of the multi-spectral imaging techniques such as MAVRIC and SEMAC to limit the selection of signal to a restricted spatial region and a restricted frequency range. The selection is limited by using a different gradient strength and/or gradient polarity during refocusing compared to excitation.

For SEMAC, this selection mechanism can be applied directly, because currently reported SEMAC acquisition schemes already include the use of gradients during excitation and refocusing. Currently reported SEMAC acquisition schemes do not only select on-resonance signal in a limited volume, but also select off-resonance signal outside that volume. Using the selection mechanism proposed here limits the selected volume as well as the selected frequency band. Therefore back-folding of distant off-resonant signal is avoided. The selected volume can be matched to the volume covered by the phase encoding of the selected slice. Reversely, it is also possible to choose the number of phase encoding steps to match the phase encoded volume to the selected volume.

To enable this selection mechanism for MAVRIC, which up until now was always reported as a non-selective acquisition technique, this invention proposes to add an excitation gradient and a refocusing gradient to the MAVRIC acquisition scheme.

There are several schemes to use different gradient strengths or different gradient signs for excitation than for refocusing to limit the selection to a restricted spatial region and a restricted frequency band.

For all MAVRIC techniques published until now, the excitation and refocusing are spatially non-selective and only select a restricted frequency-band. To make MAVRIC spatially selective, this invention proposes to use a gradient either during excitation or during refocusing or both. Using a gradient only during excitation is the same as choosing a gradient strength equal to zero during refocusing and vice versa. If a gradient is used during excitation as well as refocusing, either the strength or the sign or both strength and sign of the two gradients must be different.

The combination of the two gradients and the frequency bandwidth of the RF pulses determines the spatial range and the frequency band of the spins that are affected by both excitation and refocusing. This can be visualized in a B0-Z diagram, where B0 is directly proportional to the frequency of the spins and Z is the spatial location in the selection direction. In a B0-Z diagram, a straight vertical band is a spatially non-selective RF pulse with a limited frequency band, and a slanted band is an RF pulse with a limited frequency band in combination with a gradient. With the presence of off-resonance spins, a gradient does not necessarily limit the spatial selectivity of the RF pulse to the intended spatial location. Spins with large off-resonance frequency and with large spatial deviation from the intended spatial location may still be selected.

Choosing a refocusing gradient with opposite sign to the excitation gradient limits selection to the spatial area, which is defined by the overlap of excitation gradient and refocusing gradient. Choosing the refocusing gradient to be zero has a similar but less pronounced effect. Alternatively, the overlap and therefore the spatial selectivity can be made smaller by choosing stronger gradients with opposite sign for excitation and refocusing. This opens the possibility to perform single-slice MAVRIC, by refraining from phase encoding in the through-plane direction.

For SEMAC techniques published up until now, the excitation and refocusing are intended to be spatially selective by means of a single selection gradient which is used for both excitation and refocusing. However, also for SEMAC, the spatial selectivity is not necessarily limited to the intended spatial location due to the presence of off-resonance spins. Spins with large off-resonance frequency and with large spatial deviation from the intended spatial location may still be selected.

To improve the spatial selectivity of SEMAC, this invention proposes to use a different strength or different sign or both different strength and different sign of the selection gradient during excitation than during refocusing. This is similar to what is proposed for MAVRIC. Choosing a different gradient strength during excitation than during refocusing (FIG. 4) limits selection of a slice to the spatial area, which is defined by the overlap of excitation gradient and refocusing gradient.

In one aspect, the invention is applied to image a part of an object, notably of a patient to be examined in which a metal object is located or to image a part that is in the vicinity of a metal object. That is the metal object, if no steps are taken, can influence the image acquisition of the magnetic resonance image from the part to be imaged. In this aspect the restricted imaging region is located within a predetermined distance to a metallic object (1022) within the subject or the restricted imaging region is located such that the restricted imaging region at least partially contains the metallic object.

Embodiments of the invention may include the following techniques:
- A previously published MAVRIC-SEMAC hybrid is essentially different than the here proposed invention, since a single slab selection gradient strengths is still used for refocusing and excitation. So although this technique was presented as a volume selective version of MAVRIC, it still suffers from the risk of back-folding of distant off-resonant signal as is the case for SEMAC. And similar to SEMAC, the here proposed invention can also be applied to the MAVRIC-SEMAC hybrid technique to avoid this back-folding of distant off-resonant signal.
- By decreasing the number of phase encoding steps, and thereby undersampling the selected volume, a trade-off can be made between acquisition speed and risk for potential back-folding of off-resonant signal originating from the borders of the selected volume, depending on the frequency range of all selected signals. This trade-off may apply to volume selective MAVRIC and to SEMAC with Off-Resonance Suppression and to the MAVRIC-SEMAC hybrid with Off-Resonance Suppression.
- Embodiments may be combined with Compressed Sensing.
- Embodiments may be combined with Parallel Imaging (both image-based and k-space-based)
- Embodiments may be combined with all techniques that reconstruct full band-width images from the combination of images from a single MAVRIC spectral bin or a single SEMAC slice excitation. These reconstruction techniques may include:
    combination algorithms where the resulting signal is given by $\sqrt{\Sigma_I(S(\omega_I)^L)}$ (e.g. linear combination, sum-of-squares combination, maximum intensity projection)
    combination in the complex domain as well as in the modulus domain
    model fitting
    deconvolution or deblurring
- The invented technique can be combined with noise reduction using singular value decomposition
- The invented technique can be combined with a pre-scan which determines the frequency range per slice and thus the required SEMAC factor per slice
- The invented technique can be combined with fat suppression using a STIR pulse
- The invented technique can be combined with DIXON techniques.

Embodiments of the invention may have several applications. For example with aging population and an increasing amount of patients carrying metal implants, the need for diagnostic imaging in the presence of metal increases. Multi-spectral imaging techniques will be strong enablers of diagnostic imaging in the presence of metal and must-have's for a clinical solution for post-operative patients. Using this invention, scan durations of multi-spectral imaging techniques will be reduced making these techniques more practically useable for diagnostic imaging in the presence around metal, which may be part of but not limited to:
- Cobalt-Chrome
- Titanium
- Stainless steel
- Zirconium-oxide Embodiments may also be beneficial for applications areas include diagnosis in among others the following cases:
- evaluation of post-operative complications, including infections, integrity of surrounding soft tissue in the presence of metal objects that may include orthopaedic implants for e.g. knee, hip, spine, rib, ankle, or oncology bone reconstruction, or fixing plates and screws, or stents.
- super-paramagnetic foreign agents like iron disposition.
- Diagnostic imaging in the presence of bullets or shrapnel, e.g. resulting from surgery, trauma, profession in metal processing industry as well as therapy applications including:
- imaging around instruments for intervention for e.g. brachytherapy
- seeds implanted for brachytherapy
- needle tracking for e.g. biopsy or deep brain stimulation and possibly other areas where susceptibility artifacts limit the quality and thus the value of images.

A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network.

'Computer memory' or 'memory' is an example of a computer-readable storage medium. Computer memory is any memory which is directly accessible to a processor. Examples of computer memory include, but are not limited to: RAM memory, registers, and register files.

'Computer storage' or 'storage' is an example of a computer-readable storage medium. Computer storage is any non-volatile computer-readable storage medium. Examples of computer storage include, but are not limited to: a hard disk drive, a USB thumb drive, a floppy drive, a smart card, a DVD, a CD-ROM, and a solid state hard drive. In some embodiments computer storage may also be computer memory or vice versa.

A 'computing device' as used herein encompasses to any device comprising a processor. A 'processor' as used herein encompasses an electronic component which is able to execute a program or machine executable instruction. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. Many programs have their instructions performed by multiple processors that may be within the same computing device or which may even be distributed across multiple computing devices.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, gear sticks, steering wheel, pedals, wired glove, dance pad, remote control, and accelerometer are all examples of user interface components which enable the receiving of information or data from an operator.

A 'hardware interface' as used herein encompasses a interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

Magnetic Resonance (MR) data is defined herein as being the recorded measurements of radio frequency signals emitted by atomic spins by the antenna of a Magnetic resonance apparatus during a magnetic resonance imaging scan. A Magnetic Resonance Imaging (MRI) image is defined herein as being the reconstructed two or three dimensional visualization of anatomic data contained within the magnetic resonance imaging data. This visualization can be performed using a computer.

In one aspect the invention provides for a medical apparatus comprising a magnetic resonance imaging system for acquiring magnetic resonance data from a subject. The magnetic resonance data is acquired from an imaging zone. The medical apparatus further comprises a processor for controlling the medical apparatus. The medical apparatus further comprises a memory storing machine-executable instructions for execution by the processor. Execution of the instructions causes the processor to generate magnetic resonance control commands using a multi-spectral imaging pulse sequence. A pulse sequence as used herein encompasses a set of operations to be performed by a magnetic resonance imaging system as a function of time. Essentially a pulse sequence is a set of high level instructions for controlling the function of the magnetic resonance imaging system. A software module or such may be used to convert a pulse sequence into commands for controlling the magnetic resonance imaging system. A multi-spectral imaging pulse sequence is a pulse sequence which causes the magnetic resonance imaging system to perform multi-spectral imaging. In multi-spectral imaging is performed on several different frequencies. Imaging is performed on resonance peak and at frequencies just off the resonant frequency peak.

The pulse sequence selectively encodes magnetic resonance data from a restricted imaging region. That is to say that the pulse sequence is adapted for encoding spins within a restricted imaging region as to exclude spins outside of the restricted imaging region. The imaging zone comprises the restricted imaging region. The pulse sequence comprises an excitation magnetic field gradient and a refocus magnetic field gradient. The excitation magnetic field gradient and a refocus magnetic field gradient have a different plurality and/or a different magnitude. The excitation magnetic field gradient as used herein encompasses a magnetic field gradient that is generated by the magnetic resonance imaging system during a radio-frequency pulse that manipulates the orientation of spins within the imaging zone. The refocus magnetic field gradient as used herein encompasses a magnetic field gradient that refocuses the magnetic spins within the imaging zone. Particularly a refocus magnetic field gradient is applied just prior to the acquisition of the magnetic resonance data. The effect of using the excitation magnetic field gradient and the refocus magnetic field gradient with a different plurality and/or different magnitude is that this is the selection of the restricted imaging region.

Execution of the instructions further cause the processor to send the magnetic resonance control commands to the magnetic resonance imaging system. This may cause the magnetic resonance imaging system to acquire the magnetic resonance data. Execution of the instructions further cause the processor to received the magnetic resonance data from the magnetic resonance imaging system. Execution of the instructions further cause the processor to reconstruct a magnetic resonance image of the restricted imaging region using the magnetic resonance data. Embodiments of the invention may be advantageous because it allows the position of imaging data from the restricted imaging region and it is acquired in such a way that magnetic resonance signals from spins outside the restricted imaging region will not cause artifacts or distortions in the magnetic resonance image.

In another embodiment execution of the instructions further cause the processor to locate the restricted imaging region within a predetermined distance to a metallic object within the subject. In some embodiments the processor causes the magnetic resonance imaging system to acquire a pre-scan. The apparatus may then locate a metallic object within the pre-scan and then locate the restricted imaging region adjacent to or within a predetermined distance to the metallic object. This embodiment may be beneficial because metallic objects may cause a distortion of the B0 field and may thus cause artifacts or distortions in magnetic resonance images adjacent to the metal object. However, the multi-spectral imaging pulse as claimed is adapted for preventing distortions of the image adjacent to metallic objects.

In another embodiment execution of the instructions further cause the processor to locate the restricted imaging region such that the restricted imaging region at least partially contains the metallic object. This embodiment may be beneficial, because it allows the imaging of tissue at least partially surrounding a metallic object. For instance, the tissue surrounding a hip implant or other metallic device could be investigated.

In another embodiment the magnetic resonance imaging system comprises a magnet (1004) for generating a B0 magnetic field. The B0 magnetic field may also be referred to as the main magnetic field. The B0 magnetic field is for aligning the magnetic spins within the imaging zone. Inhomogeneity of the B0 magnetic field may cause phase encoding errors in the magnetic spins which may lead to artifacts in reconstructed magnetic resonance images.

Execution of the instructions further cause the processor to generate preliminary magnetic resonance control commands which cause the magnetic resonance imaging system to acquire preliminary magnetic resonance data. Execution of the instructions further cause the processor to reconstruct a preliminary magnetic resonance image. Execution of the instructions further cause the processor to identify a B0 inhomogeneity region within the imaging zone using the preliminary magnetic resonance image. The B0 inhomogeneity region is a region where the B0 field differs from a predetermined magnetic field strength by more than a predetermined amount. Execution of the instructions further cause the processor to locate the restricted imaging region at least partially within the B0 inhomogeneity region.

The preliminary magnetic resonance image may be a proton density image or a map of the B0 field in the imaging zone. The preliminary magnetic resonance data may therefore be either be normal proton density weighted data or may be magnetic resonance data which contains data descriptive of the B0 field. For instance a DIXON B0 mapping may be performed. In the proton density weighted image a variety of structures may be identified which cause susceptibility effects which result in induced variations in the main magnetic field (B0 field). This can be due to many things, including, but not limited to: anatomical structure (e.g., lungs), clothing, scanner accessories, metallic or non-metallic interventional equipment, metallic objects, and metallic or non-metallic implants. Standard image segmentation techniques may be used to identify the B0 inhomogeneity region in the proton density images. In the proton density images the segmented object is used to predict a B0 inhomogeneity.

In another embodiment the multi-spectral imaging pulse sequence is a MAVRIC pulse sequence. MAVRIC is an acronym for Multi-Acquisition Variable-Resonance Image Combination. MAVRIC pulse sequences minimize distortion and artifacts when limiting the excited bandwidth. MAVRIC then uses multiple resonant frequency offsets to cover the full spectral range.

In another embodiment the MAVRIC pulse sequence only one of the following has a magnitude of zero: the excitation magnetic field gradient and the re-focus magnetic field gradient.

In another embodiment for the MAVRIC pulse sequence the excitation magnetic field gradient and re-focus magnetic field gradient have opposite polarities.

In another embodiment the multi-spectral imaging pulse sequence is a SEMAC pulse sequence. SEMAC is an acronym for Slice-Encoding for Metal Artifact Correction. SEMAC corrects for distortion artifacts by building on the view-angle tilting technique and aligns resolved excitation profiles to their actual voxel locations by using additional phase encoding in the slice direction. Essentially the SEMAC technique corrects metal artifacts using encoding of each excited slice against the magnetic field inhomogeneities. Slice encoding is achieved by extending a view-angle tilting spin echo sequence in some embodiments with additional z-phase encoding.

In another embodiment the SEMAC pulse sequence only one of the following has a magnitude of zero: the excitation magnetic field gradient and the re-focus magnetic field gradient.

In another embodiment for the SEMAC pulse sequence the excitation magnetic field gradient and re-focus magnetic field gradient have opposite polarities.

In another embodiment execution of the instructions further cause the processor to generate pre-scan magnetic resonance control commands which cause the magnetic resonance imaging system to acquire preliminary magnetic resonance data. The preliminary magnetic resonance data is descriptive of the restricted imaging region. Execution of the instructions further causes the processor to reconstruct a pre-scan magnetic resonance image. Execution of the instructions further cause the processor to determine a phase encoding factor which selects the restricted imaging region using the pre-scan magnetic resonance image. This embodiment is advantageous because the SEMAC pulse sequence may be optimized for acquiring data within the restricted imaging region.

In another embodiment the pulse sequence incorporates compressed sensing. In this embodiment the full k-space is not sampled. In compressed sensing a previously acquired magnetic resonance image is used to partially reconstruct a later acquired image. This may be particularly useful in situations where there is movement in the subject and it is desirable to rapidly acquire images.

In another embodiment the pulse sequence incorporates parallel imaging.

In another embodiment the pulse sequence incorporates an inversion pulse for fat suppression.

In another embodiment execution of the instructions further cause the processor to reconstruct a full bandwidth image using the magnetic resonance data. In a multi-spectral imaging technique different regions of the image may be acquired in different spectral ranges. The full image can be reconstructed by acquiring the different portions of the images which are acquired in different spectral ranges.

In another embodiment execution of the instructions further cause the processor to perform noise reduction in the magnetic resonance image using singular value decomposition.

In another aspect the invention provides for a computer program product comprising machine-executable instructions for controlling a medical apparatus. The computer program product may for instance be stored on a computer-readable storage medium. The medical apparatus comprises a magnetic resonance imaging system for acquiring magnetic resonance data from a subject. The magnetic resonance data is acquired from an imaging zone. Execution of the instructions causes the processor to generate magnetic resonance control commands using a multi-spectral imaging pulse sequence. The pulse sequence selectively encodes magnetic resonance data from a restricted imaging region.

The imaging zone comprises the restricted imaging region. The pulse sequence comprises an excitation magnetic field gradient and a refocus magnetic field gradient. The excitation magnetic field gradient and the refocus magnetic field gradient have a different polarity and/or a different magnitude. Execution of the instructions further cause the processor to send the magnetic resonance control commands to the magnetic resonance imaging system. Execution of the instructions further cause the processor to receive the magnetic resonance data from the magnetic resonance imaging system. Execution of the instructions further cause the processor to reconstruct a magnetic resonance image of the restricted imaging region using the magnetic resonance data.

In another aspect the invention provides for a method of controlling a medical apparatus. Likewise the invention also provides for a computer-implemented method of controlling a medical apparatus. The medical apparatus comprises a magnetic resonance imaging system for acquiring magnetic resonance data from a subject. The magnetic resonance data is acquired from an imaging zone. The method comprises the step of generating magnetic resonance control commands using a multi-spectral imaging pulse sequence. The pulse sequence selectively encodes magnetic resonance data from a restricted imaging region. The imaging zone comprises the restricted imaging region. The pulse sequence comprises an excitation magnetic field gradient and a refocus magnetic field gradient. The excitation magnetic field gradient and the refocus magnetic field gradient have a different polarity and/or a different magnitude. The method further comprises the step of sending the magnetic resonance control commands to the magnetic resonance imaging system. The method further comprises the step of receiving the magnetic resonance data from the magnetic resonance imaging system. The method further comprises the step of reconstructing the magnetic resonance image of the restricted imaging region using the magnetic resonance data.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
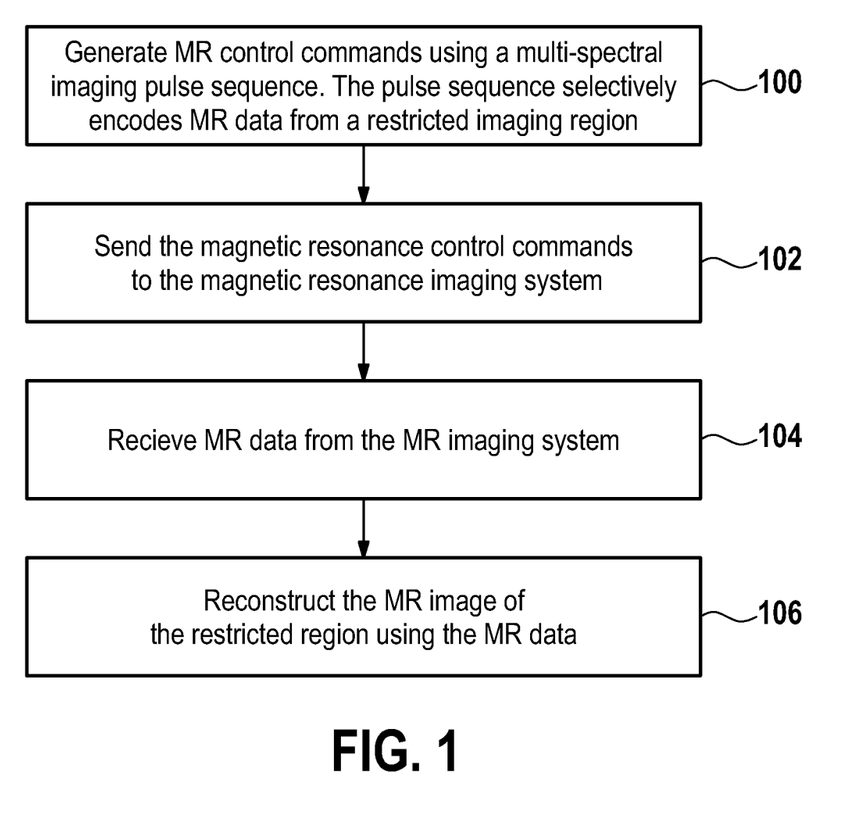
FIG. 1 shows a flow diagram which illustrates a method according to an embodiment of the invention.

FIG. 1 shows a flow diagram which illustrates a method according to an embodiment of the invention. In step 1 magnetic resonance control commands are generated using a multi-spectral imaging pulse sequence. The pulse sequence selectively encodes magnetic resonance data from a restricted imaging region. In step 102 the magnetic resonance control commands are sent to the magnetic resonance imaging system. In step 104 magnetic resonance data is received from the magnetic resonance imaging system. Finally in step 106 the magnetic resonance image is reconstructed for the restricted region using the magnetic resonance data.

Figure 2:
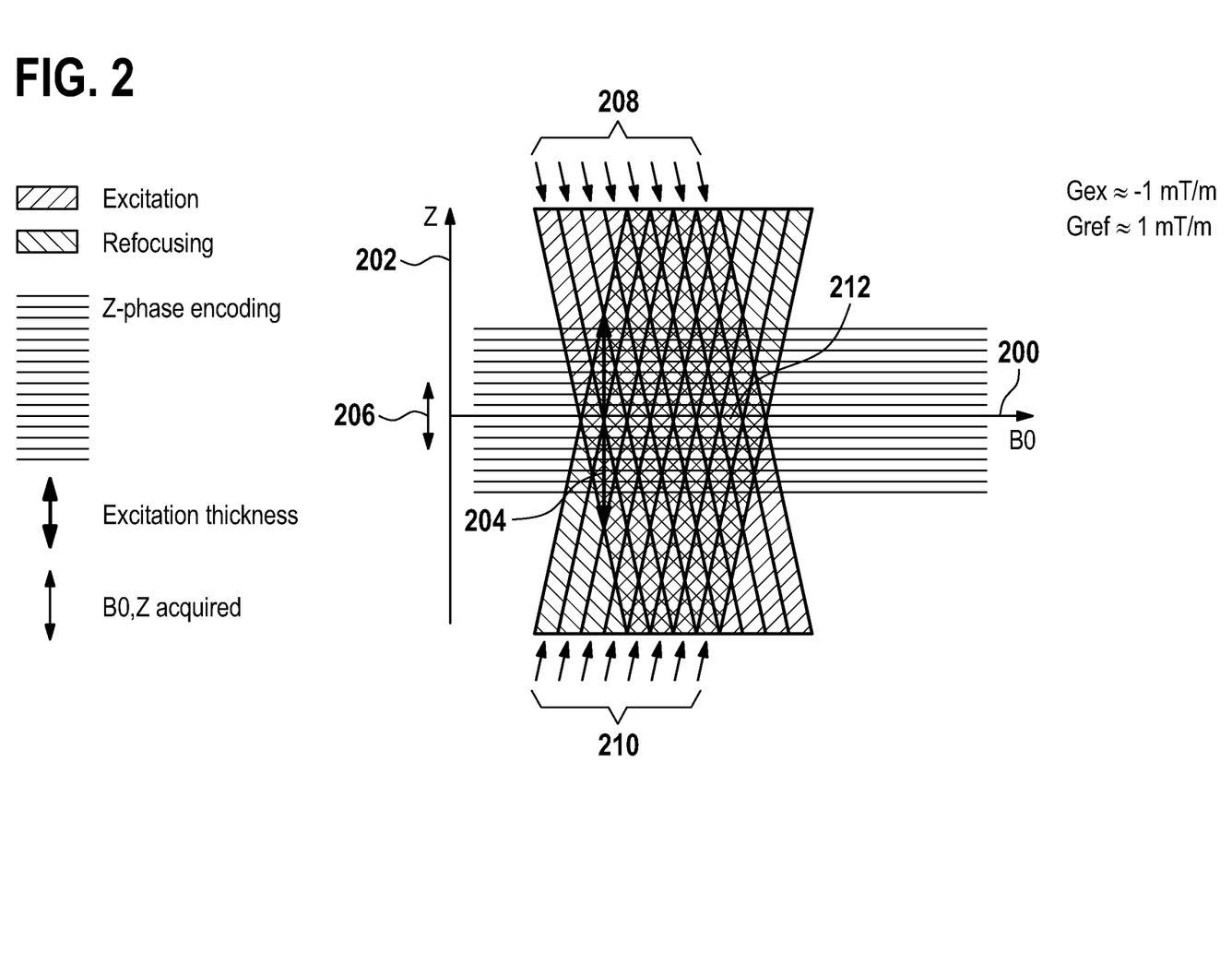
FIG. 2 shows a B0-z diagram for a MAVRIC acquisition with a gradient during excitation and an opposite gradient for refocusing.

FIG. 2 shows a B0-z diagram for a MAVRIC acquisition with a gradient during excitation and an opposite gradient for refocusing. The B0 axis is labeled 200. The z-axis is labeled 202. The arrow 204 shows the excitation thickness. The arrow 206 shows the region extent in z direction where data was acquired. The parallelograms labeled 208 represent the area of B0, z space during excitation. The parallelograms labeled 210 indicate the B0,z space during the refocusing gradient. The diamond-like region defined by an excitation 208 and refocusing gradient 210 corresponds to the restricted imaging region 212. The image illustrates how a MAVRIC pulse sequence according to an embodiment of the language may be used to selectively select the restricted imaging region 212. The horizontal lines parallel to the B0 axis 200 indicate the phase encoded space in z direction.

Figure 3:
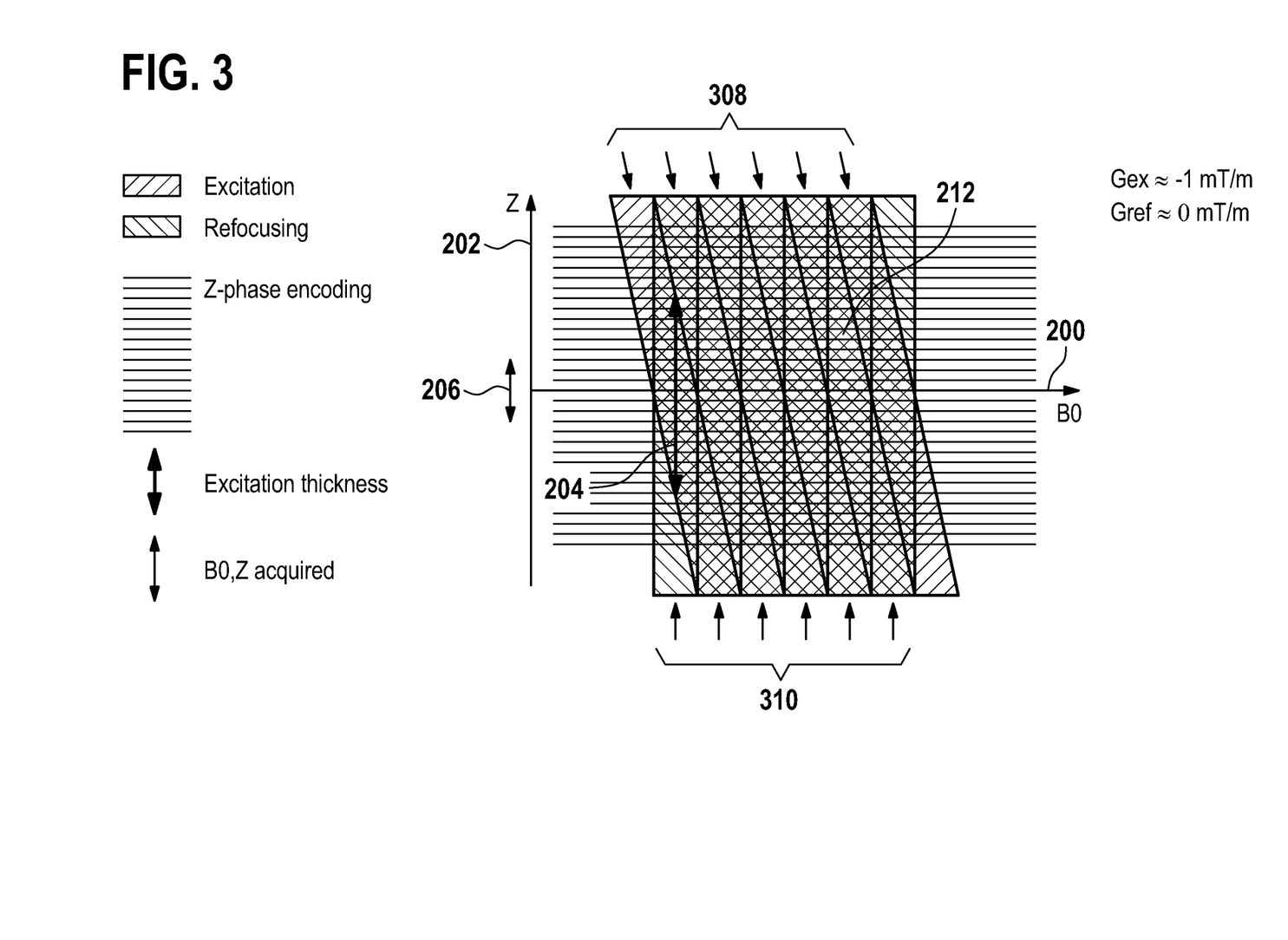
FIG. 3 shows a B0-z diagram for a MAVRIC acquisition with a gradient during excitation.

FIG. 3 shows a B0-z diagram for a MAVRIC acquisition with a gradient during excitation. In this acquisition scheme, refocusing is done without a gradient. In other embodiments another scheme may include excitation without gradient and refocusing with a gradient. The areas in B0,z space selected by the excitation gradients in this case are labeled 308 and by the focusing gradients are labeled 310. In this scan selection by the excitation gradient and the refocusing gradient 310 define a restricted imaging region 212.

Figure 4:
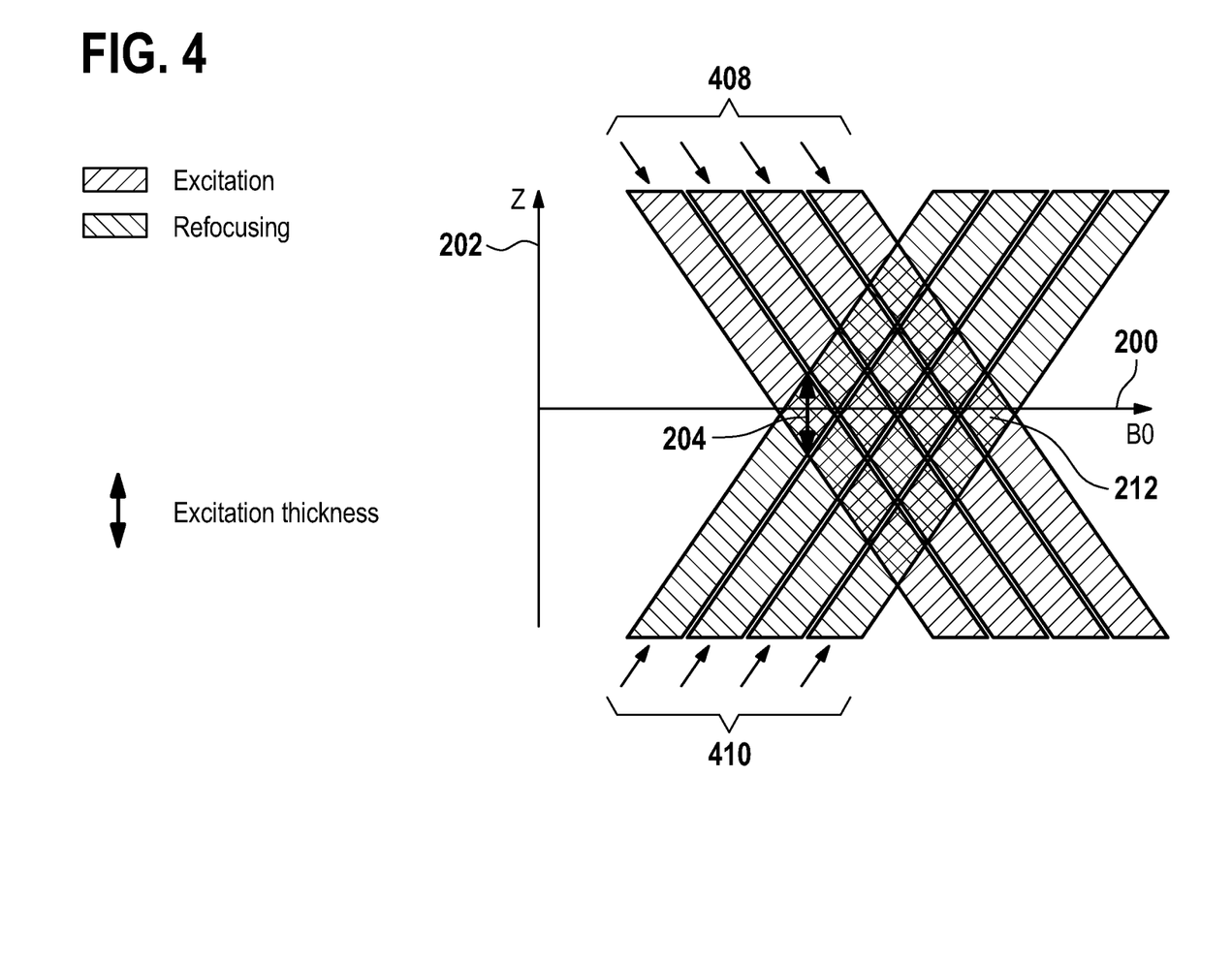
FIG. 4 shows a B0-z diagram for a MAVRIC acquisition with volume selection similar to that presented in FIG. 2.

FIG. 4 shows a B0-z diagram for a MAVRIC acquisition with volume selection similar to that presented in FIG. 2. In this case the volume selected is reduced to a single slice which removes the need to perform phase-encoding in the through-plane direction. This results in a two-dimensional MAVRIC acquisition. The areas in B0,z space selected by the excitation gradients are labeled 408, the areas in B0,z space selected by the refocusing gradients are labeled 410. The excitation and the refocusing gradient define a restricted imaging region 212.

Figure 5:
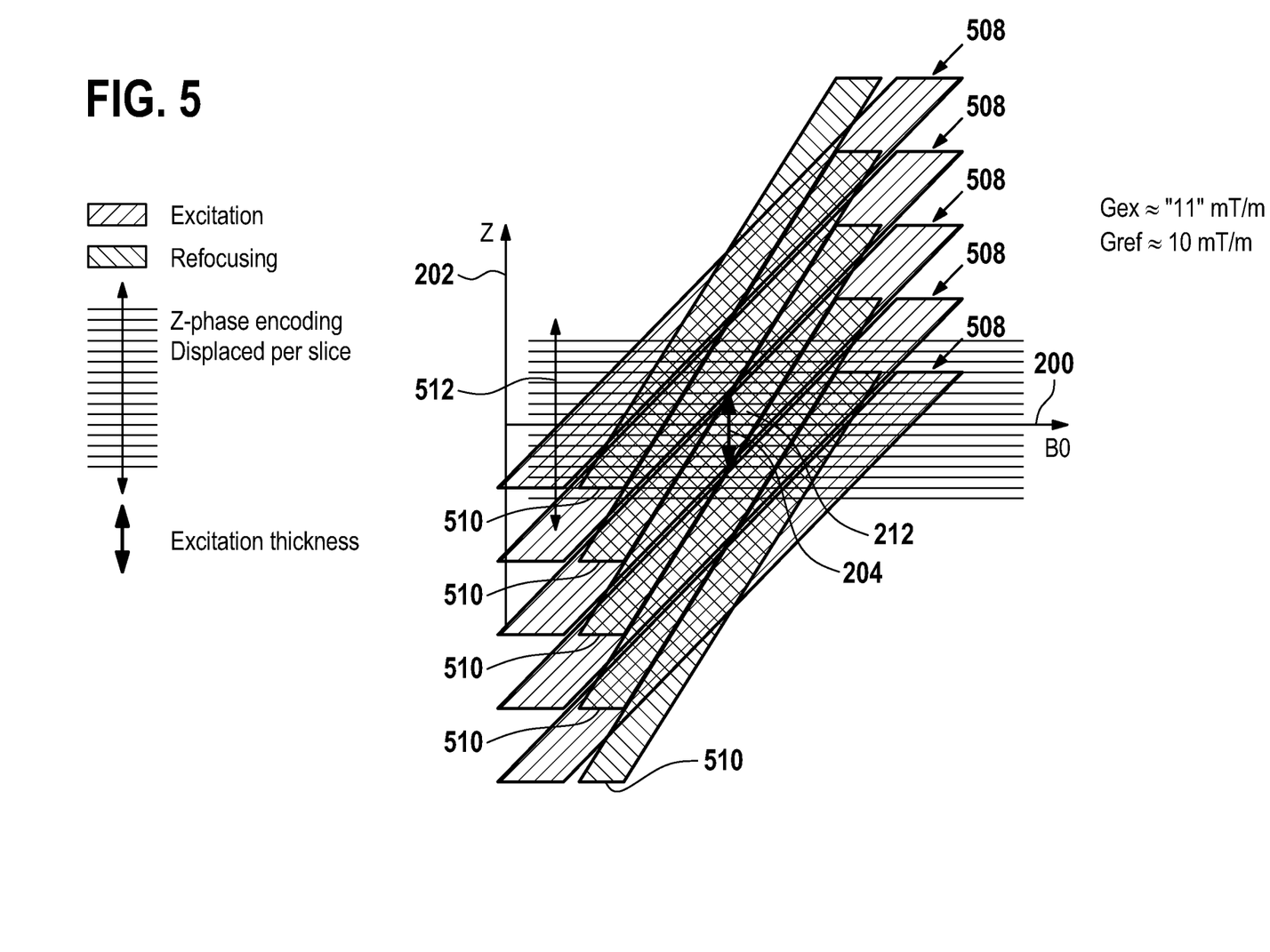
FIG. 5 shows a B0-z diagram for a SEMAC Off-Resonance Suppression pulse sequence according to an embodiment of the invention.

FIG. 5 shows a B0-z diagram for a SEMAC pulse sequence with off-resonance suppression that is known as SEMAC Off-Resonance Suppression (SEMAC-ORS). In this embodiment the excitation gradient is slightly stronger than the refocusing gradient. This same schematic view may also be used to illustrate a SEMAC-MAVRIC hybrid which uses off-resonance suppression. The region encoded by the excitation gradient is labeled 508. The regions labeled 510 are those regions encoded by the refocusing gradient. The combination of these two gradients defines a restricted imaging region 212. In the absence of off-resonant signal, the extent of this restricted imaging region would be the area which is indicated by the arrow 204 which defines the excitation thickness.

Figure 6:
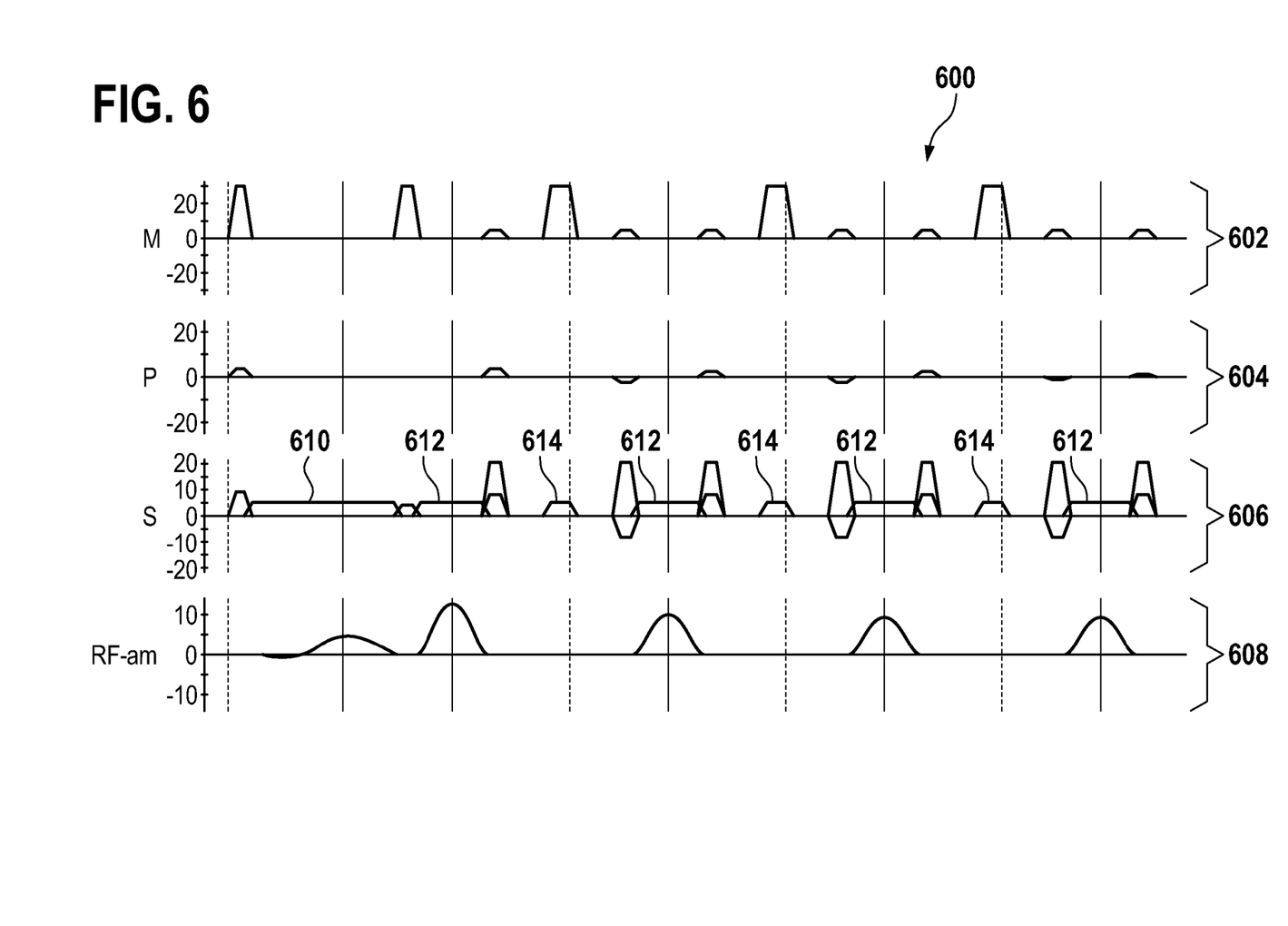
FIG. 6 shows a pulse diagram for part of a standard SEMAC pulse sequence.

FIG. 6 shows a pulse diagram for part of a standard SEMAC pulse sequence 600. In this pulse diagram the m-gradient 602, the p-gradient 604, the s-gradient 606, and the applied RF excitation 608 is shown. The s-gradient 606 is the select gradient. Within the s-gradient 606 there is shown an excitation gradient 610, and refocus gradients 612, and a VAT gradient 614. In this example the excitation gradient 610 and the refocus gradients 612 have the same magnitude.

Figure 7:
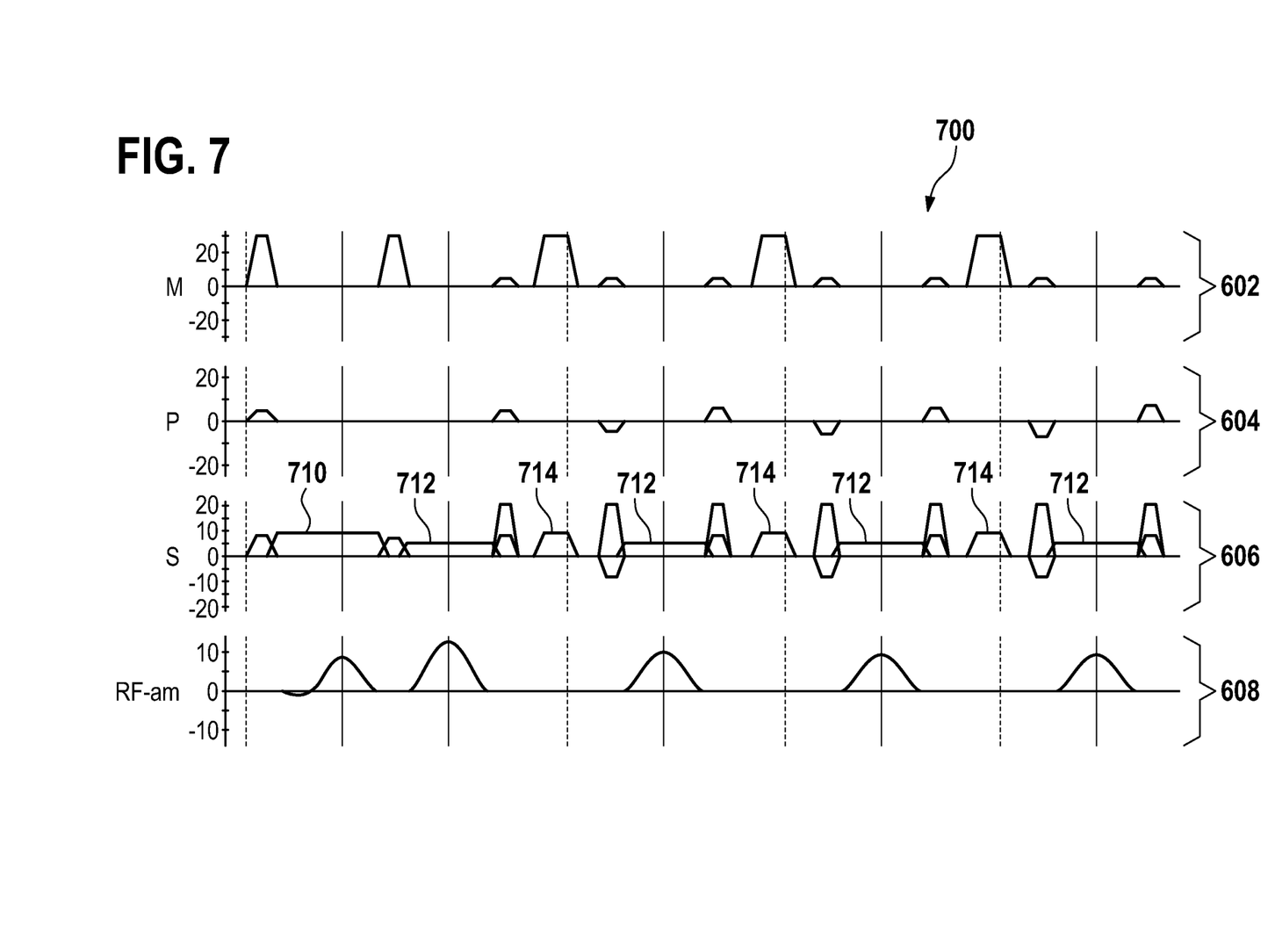
FIG. 7 shows a pulse diagram for a SEMAC Off-Resonance Suppression pulse sequence according to an embodiment of the invention.

FIG. 7 shows a pulse sequence 700 similar to that shown in FIG. 6. In this case the SEMAC pulse sequence in FIG. 6 has been altered such that it is a SEMAC-ORS pulse sequence according to an embodiment of the invention. The excitation gradient is labeled 710, the refocus gradients are labeled 712, and the VAT gradients are labeled 714. In this case the excitation gradient 710 and the refocus gradients 712 no longer have the same magnitude. The pulse sequence in FIG. 7 results in a sampling scheme similar to that shown in FIG. 5.

Figure 8:
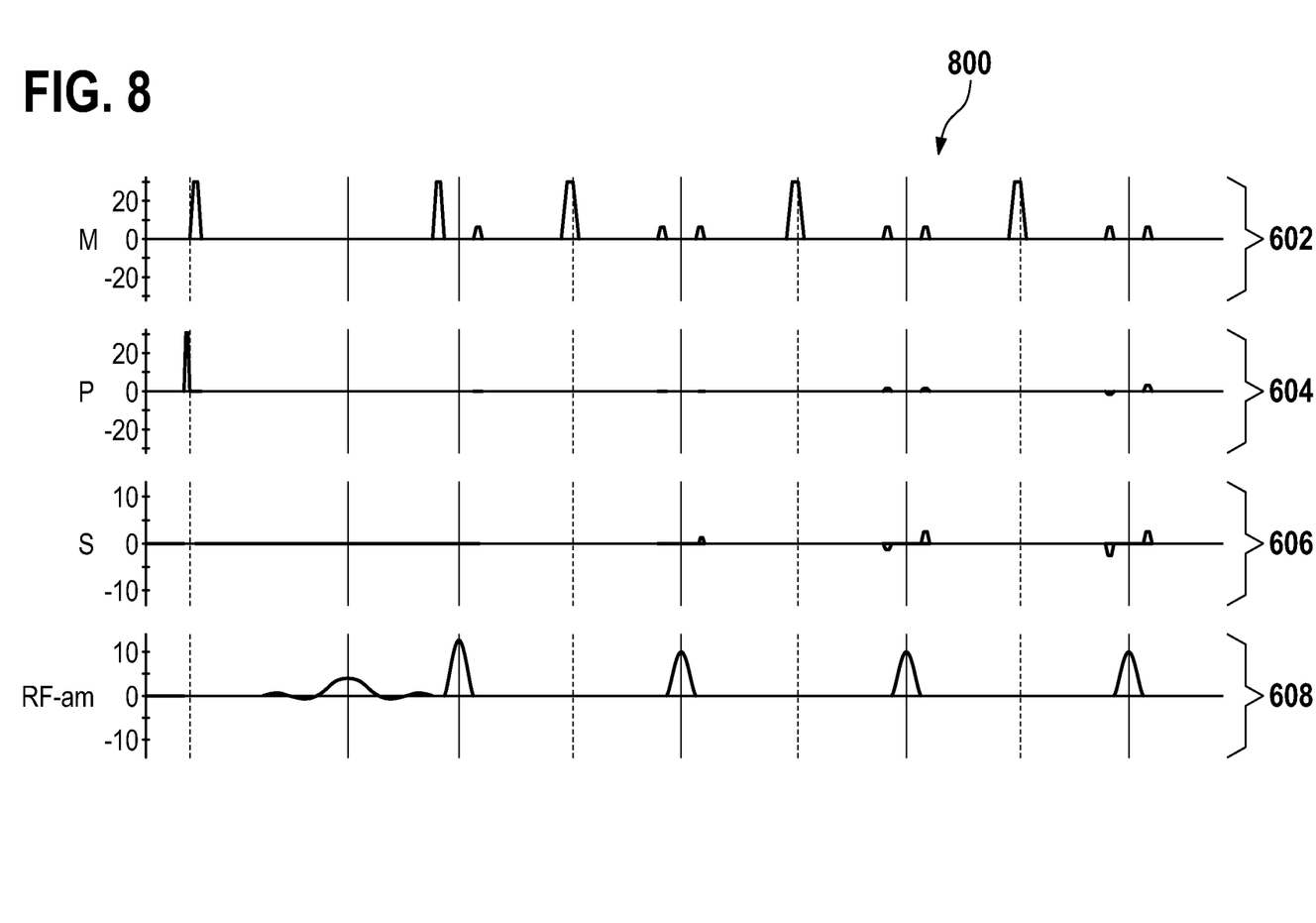
FIG. 8 shows a pulse sequence diagram for a standard MAVRIC pulse sequence.

FIG. 8 shows a pulse sequence diagram for a standard MAVRIC pulse sequence. It should be noted that in the s-gradient 606 there are no excitation and refocus gradients.

Figure 9:
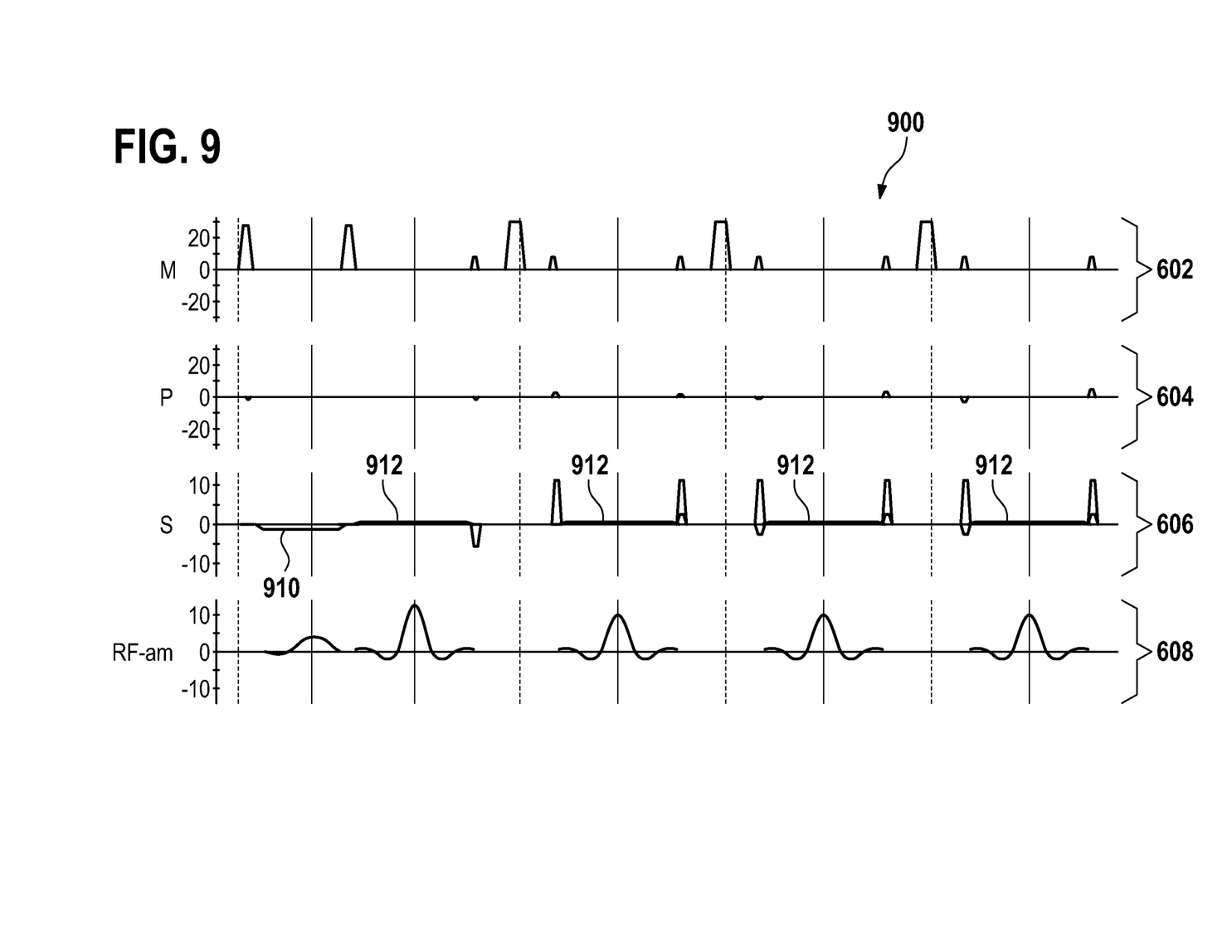
FIG. 9 shows a selective MAVRIC pulse sequence according to an embodiment of the invention.

FIG. 9 shows a selective MAVRIC pulse sequence 900 according to an embodiment of the invention. The pulse sequence of FIG. 8 has been modified such that there is now excitation gradient 910 and refocus gradients 912 of an opposite polarity. This results in a sampling scheme similar to that shown in FIG. 4.

Figure 10:
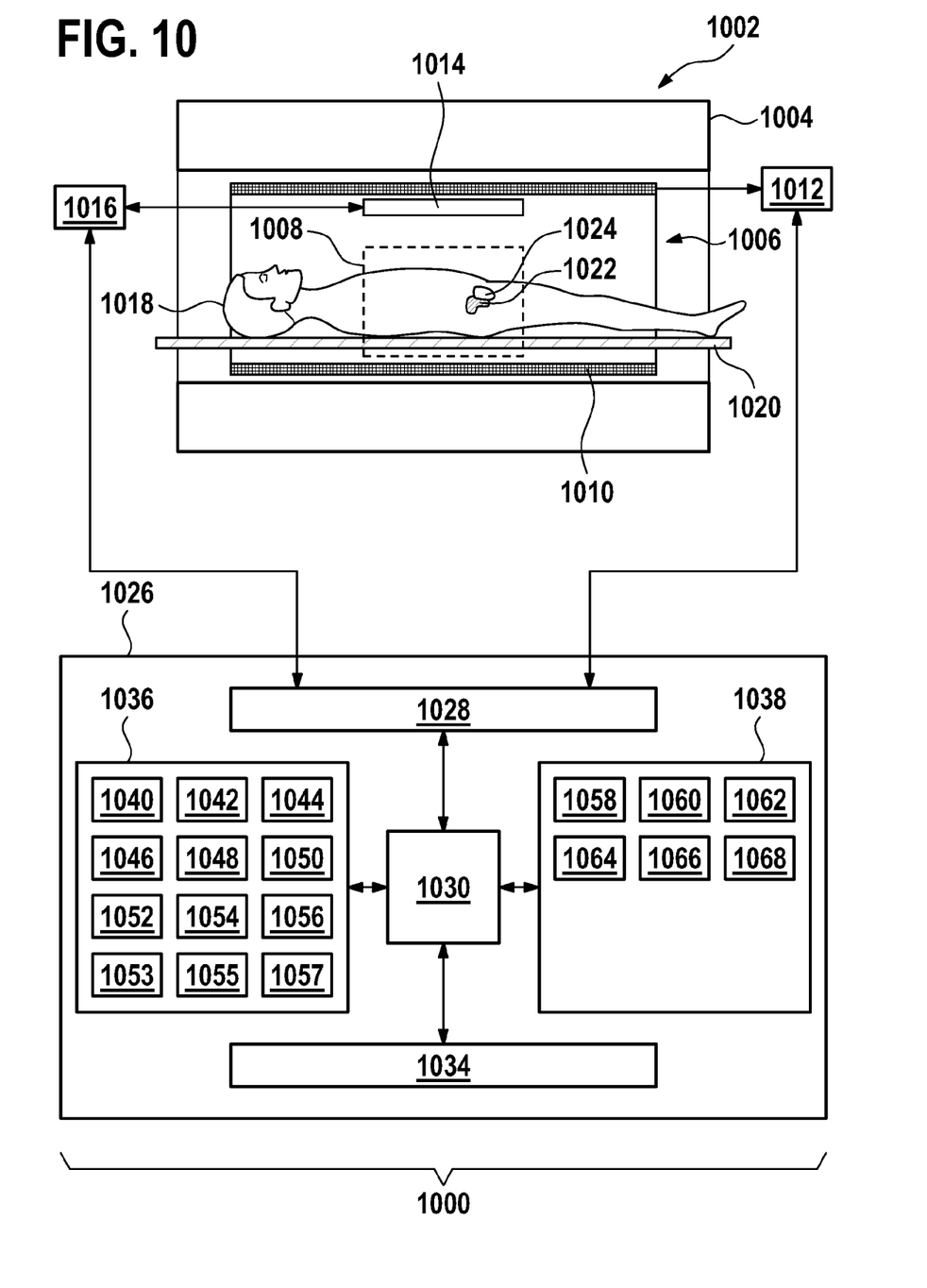
FIG. 10 illustrates a medical apparatus according to an embodiment of the invention.

FIG. 10 illustrates an example of a medical apparatus 1000 according to an embodiment of the invention. The medical apparatus 1000 comprises a magnetic resonance imaging system 1002. The magnetic resonance imaging system 1002 comprises a magnet 1004. The magnet 1004 is a superconducting cylindrical type magnet 1004 with a bore 1006 through it. The magnet 1004 has a liquid helium cooled cryostat with superconducting coils. It is also possible to use permanent or resistive magnets. The use of different types of magnets is also possible for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils. Within the bore 1006 of the cylindrical magnet 1004 there is an imaging zone 1008 where the magnetic field is strong and uniform enough to perform magnetic resonance imaging.

Within the bore 1006 of the magnet there is also a set of magnetic field gradient coils 1010 which is used for acquisition of magnetic resonance data to spatially encode magnetic spins within the imaging zone 1008 of the magnet 1004. The magnetic field gradient coils 1010 connected to a magnetic field gradient coil power supply 1012. The magnetic field gradient coils 1010 are intended to be representative. Typically magnetic field gradient coils 1010 contain three separate sets of coils for spatially encoding in three orthogonal spatial directions. A magnetic field gradient power supply supplies current to the magnetic field gradient coils. The current supplied to the magnetic field gradient coils 1010 is controlled as a function of time and may be ramped or pulsed.

Adjacent to the imaging zone 1008 is a radio-frequency coil 1014 for manipulating the orientations of magnetic spins within the imaging zone 1008 and for receiving radio transmissions from spins also within the imaging zone 1008. The radio frequency antenna may contain multiple coil elements. The radio frequency antenna may also be referred to as a channel or antenna. The radio-frequency coil 1014 is connected to a radio frequency transceiver 1016. The radio-frequency coil 1014 and radio frequency transceiver 1016 may be replaced by separate transmit and receive coils and a separate transmitter and receiver. It is understood that the radio-frequency coil 1014 and the radio frequency transceiver 1016 are representative. The radio-frequency coil 1014 is intended to also represent a dedicated transmit antenna and a dedicated receive antenna. Likewise the transceiver 1016 may also represent a separate transmitter and receivers.

A subject 1018 is reposed on a subject support 1020 within the bore 1006 of the magnet 1004. The subject 1018 is partially within the imaging zone 1008. The subject has a metallic object 1022 within it. There is a restricted imaging region 1024 adjacent to the metallic object 1022. The metallic object 1022 causes distortions of the B0 field generated by the magnet 1004. Although the metallic object 1022 creates distortions in the B0 field the medical apparatus 1000 is able to acquire artifact image from the restricted imaging region 1024. The magnetic field gradient coil power supply 1012 and the transceiver 1016 are connected to a hardware interface 1028 of computer system 1026. The computer system 1026 further comprises a processor 1030. The processor 1030 is connected to the hardware interface 1028, a user interface 1034, computer storage 1036, and computer memory 1038.

The computer storage 1036 is shown as containing a multi-spectral imaging pulse sequence 1040. The computer storage 1036 is further shown as containing magnetic resonance control commands 1042 which have been generated from the multi-spectral imaging pulse sequence 1040. The computer storage 1036 is further shown as containing magnetic resonance data 1044 which was acquired using the magnetic resonance control commands 1042 by the magnetic resonance imaging system 1002. The computer storage 1036 is further shown as containing a magnetic resonance image 1046 of the restricted imaging region 1024 using the magnetic resonance data 1044. The computer storage 1036 is further shown as containing items 1048, 1050, 1052, 1054, and 1056. These items are not present in all embodiments. Item 1048 is a pre-scan magnetic resonance control commands. Item 1050 is pre-scan magnetic resonance data 1050 which is acquired using the pre-scan magnetic resonance control commands 1048. Item 1052 is pre-scan magnetic resonance image that was generated using the pre-scan magnetic resonance data 1050. The computer storage 1036 shows phase encoding factor 1054 for a SEMAC pulse sequence that was generated using the pre-scan magnetic resonance image 1052. The computer storage 1036 is further shown as containing a full bandwidth image 1056 that has been reconstructed from a collection of restricted imaging regions. Each restricted imaging region is acquired using a separate frequency. By full bandwidth it means that these images from different frequency regions are combined into a full image.

The computer storage 1036 is further shown as containing preliminary magnetic resonance data 1053, preliminary magnetic resonance image 1055, and the location of B0 inhomogeneity region 1057 identified in the preliminary magnetic resonance image 1055. In some embodiments the preliminary magnetic resonance image is a B0 map.

The computer memory 1038 is shown as containing a control module 1058. The control module 1058 contains computer executable code for controlling the operation and function of the medical apparatus 1000. The computer memory 1038 is further shown as containing a command generation module 1060. The command generation module 1060 is adapted for generating magnetic resonance control commands 1042, and pre-scan magnetic resonance control commands 1048, and preliminary magnetic resonance control commands from pulse sequences 1040. The computer memory 1038 is further shown as containing an image reconstruction module 1062. The image reconstruction module 1062 contains computer executable code for reconstructing magnetic resonance images 1046, 1052, 1055 from magnetic resonance data 1044, 1050, 1053. The computer memory 1038 is further shown as containing a phase encoding factor determination module 1064. The phase encoding factor determination module 1064 contains computer-executable code for calculating the phase encoding factor 1054 from the pre-scan magnetic resonance image 1052. The computer memory 1038 is further shown as containing a full bandwidth image reconstruction module 1066. The full bandwidth image reconstruction module 1066 contains computer-executable code which is used for reconstructing the full bandwidth image 1056.

The computer memory is further shown as containing an image segmentation module 1068 which may be present in some embodiments for identifying an object in the magnetic resonance image 1055 which results in a B0 field inhomogeneity. The location of the B0 inhomogeneity region was identified and selected using the image segmentation module 1068.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A magnetic resonance imaging system for acquiring magnetic resonance data from an imaging zone of a subject, the magnetic resonance imaging system comprising:
   a memory configured to store machine executable instructions for execution by a processor, the execution of the instructions causes the processor to:
      generate magnetic resonance control commands using one of a MAVRIC and a SEMAC imaging pulse sequence, wherein the pulse sequence selectively encodes magnetic resonance data from a restricted imaging region and excludes spins outside the restriction region, by one of:
         applying an excitation magnetic field gradient and a refocus magnetic field gradient, the excitation magnetic field gradient and the refocus magnetic field gradient having a different polarity and/or a different magnitude such that the restricted imaging region is defined by an overlap of the excitation magnetic field gradient and the refocus magnetic field gradient; or
         applying a non-selective RF pulse with a limited frequency bandwidth and an RF pulse in combination with one of the excitation magnetic field gradient and the refocus magnetic field gradient;
      send the magnetic resonance control commands to a magnetic resonance imager;
      receive the magnetic resonance data from the magnetic resonance imager; and
      reconstruct a magnetic resonance image of the restricted imaging region using the magnetic resonance data.

2. The magnetic resonance imaging system of claim 1, wherein the magnetic resonance imager comprises a magnet for generating a B0 magnetic field, wherein execution of the instructions further cause the processor to:
   generate preliminary magnetic resonance control commands which cause the magnetic resonance imager to acquire preliminary magnetic resonance data;
   reconstruct a preliminary magnetic resonance image; and
   identify a B0 inhomogeneity region within the imaging zone using the preliminary magnetic resonance image, wherein the B0 inhomogeneity region is a region where the B0 field differs from a predetermined magnetic field strength by more than a predetermined amount,
   locate the restricted imaging region at least partially within the B0 inhomogeneity region.

3. The magnetic resonance imaging system of claim 1, wherein the imaging pulse sequence is a SEMAC pulse sequence and the excitation magnetic field gradient and the refocus magnetic field gradient have opposite polarities.

4. A magnetic resonance imaging system for acquiring magnetic resonance data from a subject, wherein the magnetic resonance data is acquired from an imaging zone, the magnetic resonance imaging system comprising:
   a memory storing machine executable instructions for execution by a processor,
   wherein execution of the instructions cause the processor to:
   generate pre-scan magnetic resonance control commands which cause the magnetic resonance data acquisition system to acquire pre-scan magnetic resonance data, wherein the pre-scan magnetic resonance data is descriptive of a restricted imaging region;
   reconstruct a pre-scan magnetic resonance image;
   determine a phase encoding factor which selects the restricted imaging region using the pre-scan magnetic resonance image;
   generate magnetic resonance control image commands using a multi-spectral imaging pulse sequence, wherein the multi-spectral imaging pulse sequence is a SEMAC pulse sequence, wherein the pulse sequence selectively encodes magnetic resonance data from the restricted imaging region, wherein the imaging zone comprises the restricted imaging region, wherein the pulse sequence comprises an excitation magnetic field gradient and a refocus magnetic field gradient, wherein the excitation magnetic field gradient and the refocus magnetic field gradient have a different polarity and/or a different magnitude;
send the scan magnetic resonance control image commands to the magnetic resonance data acquisition system;
receive the magnetic resonance image data from the magnetic resonance data acquisition system; and
reconstruct a magnetic resonance image of the restricted imaging region using the magnetic resonance data.

5. The magnetic resonance imaging system of claim 4, wherein the excitation magnetic field gradient and the refocus magnetic field gradient have opposite polarities.

6. A magnetic resonance imaging system comprising:
a processor;
a memory configured to store machine executable instructions for execution by the processor, wherein execution of the instructions controls the processor to:
generate magnetic resonance control commands configured to control a magnetic resonance data acquisition system to acquire magnetic resonance data from an imaging zone of a subject by applying a multi-spectral imaging pulse sequence, wherein the pulse sequence selectively encodes magnetic resonance data from a restricted imaging region, wherein the imaging zone comprises the restricted imaging region, wherein the pulse sequence comprises an excitation magnetic field gradient and a refocus magnetic field gradient, wherein the excitation magnetic field gradient and the refocus magnetic field gradient have a different polarity and/or a different magnitude;
receive the selectively encoded magnetic resonance data from the magnetic resonance data acquisition system; and
reconstruct a full bandwidth image of the restricted imaging region using the magnetic resonance data.

7. The magnetic resonance imaging system of claim 6, wherein the multi-spectral imaging pulse sequence is a MAVRIC pulse sequence.

8. The magnetic resonance imaging system of claim 6, wherein the pulse sequence incorporates compressed sensing.

9. The magnetic resonance imaging system of claim 6, wherein the pulse sequence incorporates parallel imaging.

10. The magnetic resonance imaging system of claim 6, wherein the pulse sequence incorporates an inversion pulse for fat suppression.

11. The magnetic resonance imaging system of claim 6, wherein the execution of the instructions further cause the processor to perform noise reduction in the magnetic resonance image using singular value decomposition.

12. A magnetic resonance imaging method for generating a magnetic resonance image of a restricted imaging region of a subject, the method comprising:
generating magnetic resonance control commands that control a magnetic resonance system to apply a multi-spectral imaging pulse sequence to selectively encode magnetic resonance data from the restricted imaging region and exclude spins outside the restricted image region, wherein the pulse sequence comprises an excitation RF pulse in combination with an excitation magnetic field gradient and a refocus RF pulse in combination with a refocus magnetic field gradient, wherein the excitation magnetic field gradient and the refocus magnetic field gradient have a different polarity and/or a different magnitude;
reconstructing the magnetic resonance data into a magnetic resonance image of the restricted imaging region.

13. A non-transitory computer-readable medium carrying machine executable instructions for controlling one or more processors to perform the method of claim 12.

14. The method of claim 12, further including:
applying a non-selective RF pulse with a limited frequency band with the excitation magnetic field gradient and applying a refocusing RF pulse in combination with the refocusing magnetic field gradient.

15. The method of claim 12, further including:
prior to applying the excitation magnetic field gradient:
applying a pre-scan magnetic resonance sequence to generate pre-scan magnetic resonance data descriptive of the restrictive imaging region;
reconstruct the pre-scan magnetic resonance data into a pre-scan magnetic resonance image; and
using the pre-scan magnetic resonance image, determining a phase-encoding factor for selecting the restricted imaging region.

16. The method of claim 12, wherein reconstructing the magnetic resonance data includes reconstructing a full bandwidth image of the restricted imaging region.

17. A magnetic resonance imaging system comprising a magnetic resonance data acquisition system including a main magnet, at least one RF coil, and gradient coils;
one or more processors programmed to perform the method of claim 12 to control the magnetic resonance data acquisition system to acquire the magnetic resonance data and to reconstruct the acquired magnetic resonance data into a magnetic resonance image; and
a display device configured to display the reconstructed magnetic resonance image.

18. One or more processors configured to perform the method of claim 12.

* * * * *